United States Patent
Chang

(10) Patent No.: US 9,318,846 B2
(45) Date of Patent: Apr. 19, 2016

(54) ELECTRICAL CONNECTOR WITH LOADING COMPONENT

(71) Applicant: HON HAI PRECISION INDUSTRY CO., LTD., New Taipei (TW)

(72) Inventor: Chun-Yi Chang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 379 days.

(21) Appl. No.: 14/023,421

(22) Filed: Sep. 10, 2013

(65) Prior Publication Data

US 2014/0073165 A1    Mar. 13, 2014

(30) Foreign Application Priority Data

Sep. 10, 2012 (TW) .............................. 101217456 U
Sep. 18, 2012 (TW) .............................. 101217985 U

(51) Int. Cl.
| | |
|---|---|
| H01R 13/629 | (2006.01) |
| H01R 13/622 | (2006.01) |
| H01L 23/32 | (2006.01) |
| H05K 7/14 | (2006.01) |
| H05K 7/10 | (2006.01) |
| H01R 13/447 | (2006.01) |

(52) U.S. Cl.
CPC .......... *H01R 13/62916* (2013.01); *H01L 23/32* (2013.01); *H01R 13/447* (2013.01); *H01R 13/622* (2013.01); *H05K 7/1084* (2013.01); *H05K 7/1404* (2013.01)

(58) Field of Classification Search
CPC ............. H01R 13/62916; H01L 23/32; H05K 7/1084; H05K 7/1404
See application file for complete search history.

(56) References Cited

U.S. PATENT DOCUMENTS

| | | | | |
|---|---|---|---|---|
| 4,868,714 A * | 9/1989 | Banjo | ............... | H01R 13/4534 361/617 |
| 5,127,837 A * | 7/1992 | Shah | ................. | G01R 1/0408 439/248 |
| 5,397,919 A * | 3/1995 | Tata | .................... | H01L 23/4006 257/706 |
| 5,477,161 A * | 12/1995 | Kardos | ............... | G01R 1/0425 324/537 |
| 5,770,891 A * | 6/1998 | Frankeny | ............... | H05K 3/325 257/698 |
| 5,793,618 A * | 8/1998 | Chan | .................. | H01R 13/6215 257/726 |
| 6,014,315 A * | 1/2000 | McCullough | ......... | H01L 23/367 165/80.2 |
| 6,058,014 A * | 5/2000 | Choudhury | .......... | H05K 7/1061 257/719 |
| 6,449,162 B1 * | 9/2002 | Corbin, Jr. | .......... | H01L 23/4006 257/719 |
| 6,533,589 B1 * | 3/2003 | Palaniappa | .............. | H01L 23/32 439/331 |
| 6,741,470 B2 * | 5/2004 | Isenburg | ............. | H01L 23/4093 165/80.3 |
| 7,242,583 B2 * | 7/2007 | Amber | ................ | H01L 21/4882 257/E23.09 |
| 7,280,363 B2 * | 10/2007 | Reyzin | ................ | H01L 23/4338 165/80.4 |
| 7,658,633 B1 | 2/2010 | Terhune et al. | | |
| 2003/0129859 A1 * | 7/2003 | Ye | ...................... | H01R 13/4534 439/64 |
| 2014/0038437 A1 * | 2/2014 | Liao | ....................... | H01R 13/62 439/73 |
| 2014/0073165 A1 * | 3/2014 | Chang | ................. | H01R 13/447 439/342 |

* cited by examiner

*Primary Examiner* — James Harvey
(74) *Attorney, Agent, or Firm* — Wei Te Chung; Ming Chieh Chang

(57) ABSTRACT

An electrical connector for use with an electronic package, includes an insulative housing with contacts, a cover assembled on the housing and including a main body with a mating portion, the mating portion formed with an entrance, and a loading component engaging with the mating portion of the cover and passing through the entrance of the cover to directly press the electronic package.

17 Claims, 7 Drawing Sheets

US 9,318,846 B2

ELECTRICAL CONNECTOR WITH LOADING COMPONENT

This application claims priority under 35 U.S.C. 119 from Taiwan application No. 101217456, filed Sep. 10, 2012 and No. 101217985, filed Sep. 18, 2012 the contents of which are incorporated herein by references.

BACKGROUND OF THE INVENTION

1. Field of the Invention

The present invention relates to an electrical connector, and more particularly to the electrical connector having a loading component to press an electronic package steadily mounted therein.

2. Description of Related Art

U.S. Pat. No. 7,658,633 issued to Terhune et al. on Oct. 22, 2008 discloses a socket adapted for electrically connecting an IC package and a PCB, comprising a body mounted on the PCB for electrically connecting the IC package, two bolts mounted on the PCB and beside the body and a clip for retaining the IC package in the body. The bolt has a header portion on the top with biggest size, a middle portion and a screw portion engaging with the PCB. The clip has two attaching portions, each defining a latch at a free end thereof, the clip links with the bolt by inserting the attaching portion toward the bolt to make the middle portion be received in the latch and the header portion is located upon the latch to prevent the attaching portion from upward movement.

As is well understood in the art, the trend of the printed circuit board becomes more and more smaller, so the bolt of the electrical connector mounted on the printed circuit board will not favor of miniaturization.

Therefore, an improved electrical connector is needed.

SUMMARY OF THE INVENTION

An object of the present invention is to provide an electrical connector having loading component to press an electrical connector steadily mounted therein.

According to one aspect of the present invention, an electrical connector for assembing an electronic package, comprises an insulative housing with contacts, a cover assembled on the housing and including a main body with a mating portion, the mating portion formed with an entrance, and a loading component engaging with the mating portion of the cover and passing through the entrance of the cover to directly press the electronic package.

According to another aspect of the present invention, a loading system for an electrical connector, comprises an electronic package, a cover including a main portion located upon the electronic package and a mating portion disposed on the main portion, and a loading component located between the cover and the electronic package such that the loading component has a bottom surface to press a top side of the electronic package.

Other objects, advantages and novel features of the invention will become more apparent from the following detailed description of a preferred embodiment when taken in conjunction with the accompanying drawings.

DETAILED DESCRIPTION OF THE INVENTION

Figure 1:
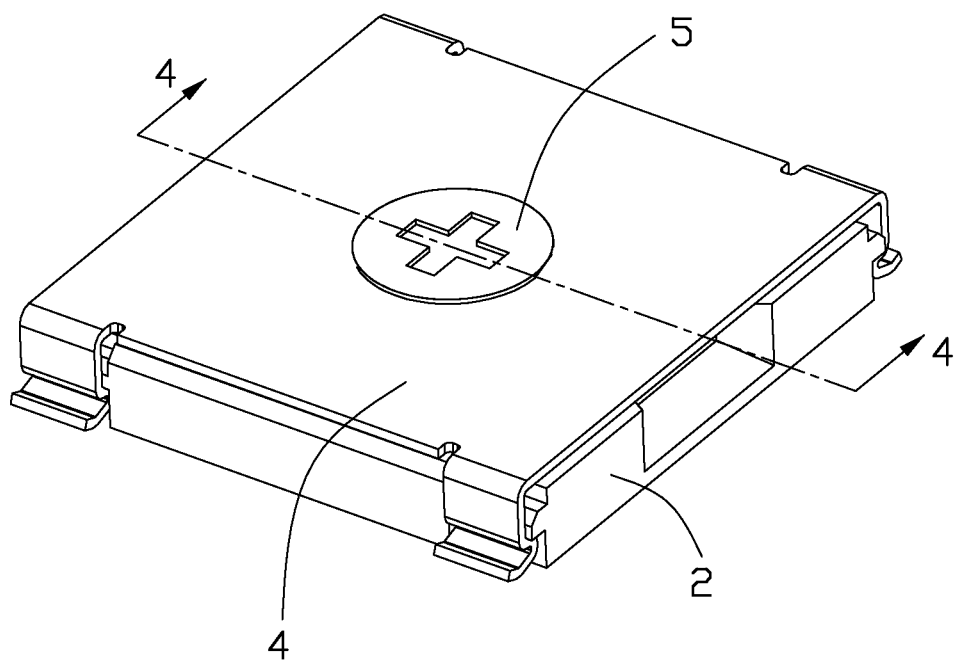
FIG. 1 is an assembled, perspective view of an electrical connector in accordance with the first embodiment of the present invention.
Figure 3:
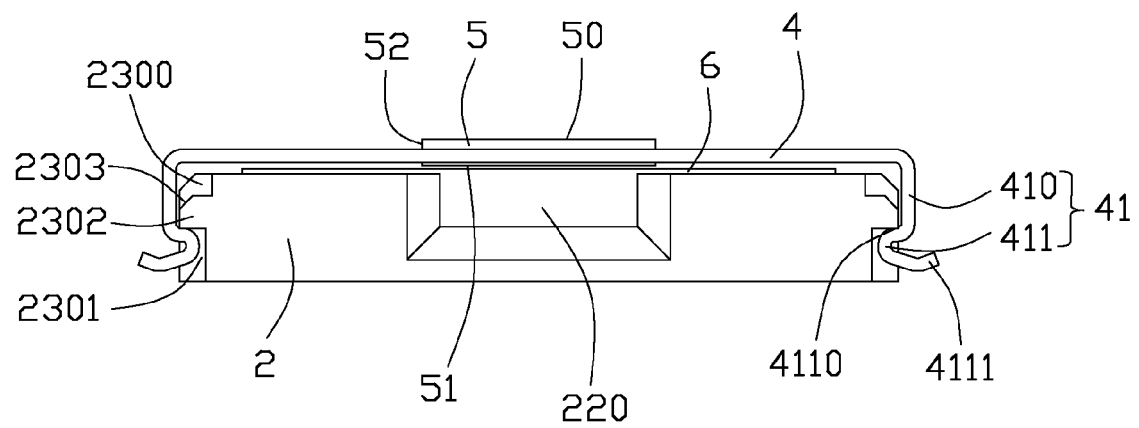
FIG. 3 is a side view of the electrical connector shown in FIG. 1.

Referring to FIGS. 1 and 3, an electrical connector used for electrical connecting an electronic package 6, comprises an insulative housing 2 with a plurality of contacts 3, a cover 4 mounted on the insulative housing 2 and a loading component 5 providing a downward force to the electronic package 6 in a vertical direction.

Figure 2:
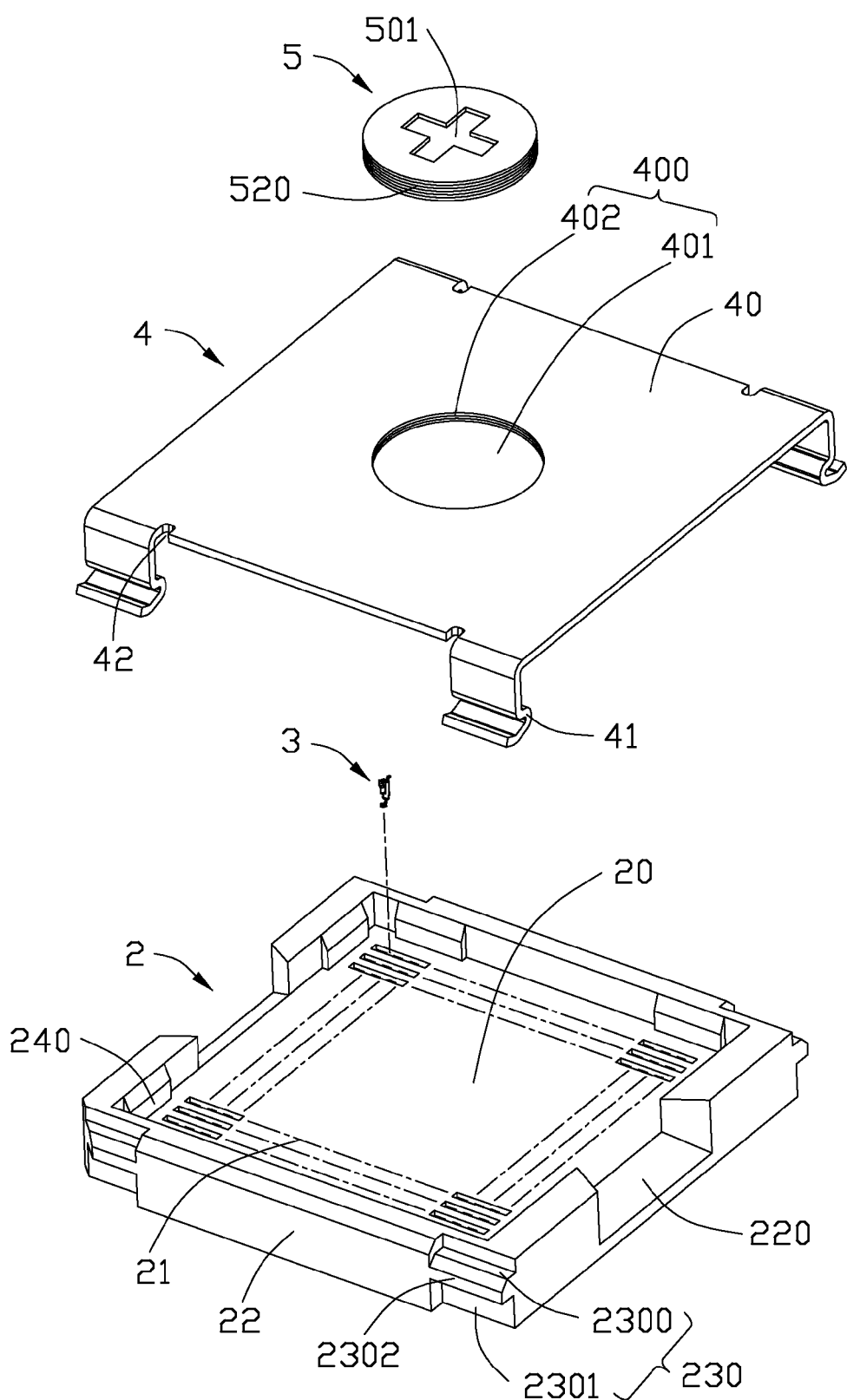
FIG. 2 is an exploded, perspective view of the electrical connector shown in FIG. 1.

Referring to FIGS. 2 and 3, the insulative housing 2 is rectangular in shape and includes a base 21 with an array of contacts 3 disposed therein. The insulative housing 2 further includes two pair of opposite periphery sidewalls 22 combing with the base 21 to form a cavity 20 for receiving the electronic package 6. Recesses 220 are provided in one pair of the periphery sidewalls 22 and pass through the periphery sidewalls 22 to communicate with the cavity 20 to provide a receiving space for fingers of operator to handle. Another pair of periphery sidewalls 22 have engaging portions 230 each with a top engaging portion 2300 and a lower engaging portion 2301 in the vertical direction. The top engaging portion 2300 and the lower engaging portion 2301 forms a rib 2302 located therebetween. The rib 2302 defines a chamfer 2303 disposed upon thereof. Two adjacent periphery sidewalls 22 include anchoring blocks 240 to make the electronic package 6 exactly and steadily inserted into the cavity 20 of the insulative housing 2.

Referring to FIGS. 2 to 3, the cover 4 is made of metallic material and includes a main body 40 with a mating portion 400 that will be described in more detail hereinafter. The main body 40 has latches 41 extending downwardly from edges to engage with the engaging portion 230. Adjacent each latch 41 defines a gap 42 on the main body 40 used for increasing flexibility for the latch 41. Each latch 41 includes a contacting portion 410 extending downwardly from the main body 40 and a bent portion 411 extending downwardly from the contacting portion 410. The bent portion 411 includes a mating surface 4110 extending inwardly to engage with a bottom surface of the rib 2302 and an end portion 4111 extending outwardly for operation by operator. When the cover 4 assembled with the insulative housing 2, the bent portion 411 is lead by the chamfer 2303 into the lower engaging portion 2301 of the insulative housing 2 and the mating surface 4110 engaged with the bottom surface of the rib 2302 to hold the cover 4 to the insulative housing 2.

Figure 4:
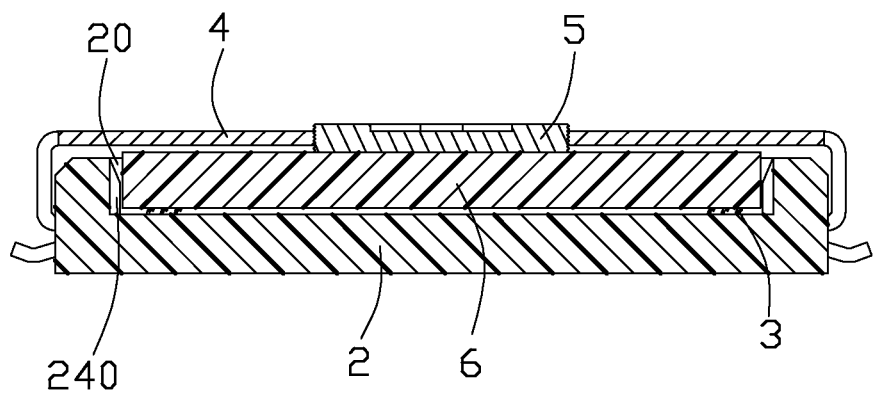
FIG. 4 is a cross-section view taken along line 4-4 of FIG. 1.

FIGS. 2-4 show the first embodiment of the loading component 5 with the corresponding mating portion 400. The loading component 5 has a flat cylinder in shape with a top surface 50, a bottom surface 51, and a cylindrical surface 52. The top surface 50 defines a groove 501 for a tool (not shown) to rotate the loading component 5 upwardly and downwardly in the vertical direction. The mating portion 400 includes a circular aperture 401 defined on a center of the main body 40. The aperture 401 edge defines internal screw thread 402 which is cooperated with external thread 520 defined on the cylindrical surface 52 of the loading component 5.

FIGS. 1 to 3 shows the loading component 5 assembled with the mating portion 400 of the cover 4. The loading component 5 is assembled into the aperture 401 of the mating portion 400 and the bottom surface 51 of the loading component 5 is used to urge a top side of the electronic package 6. The loading component 5 can exert a force to the electronic package 6 to adjust the loading component 5 near and far away respective to the cover 4 in the vertical direction.

Figure 5:
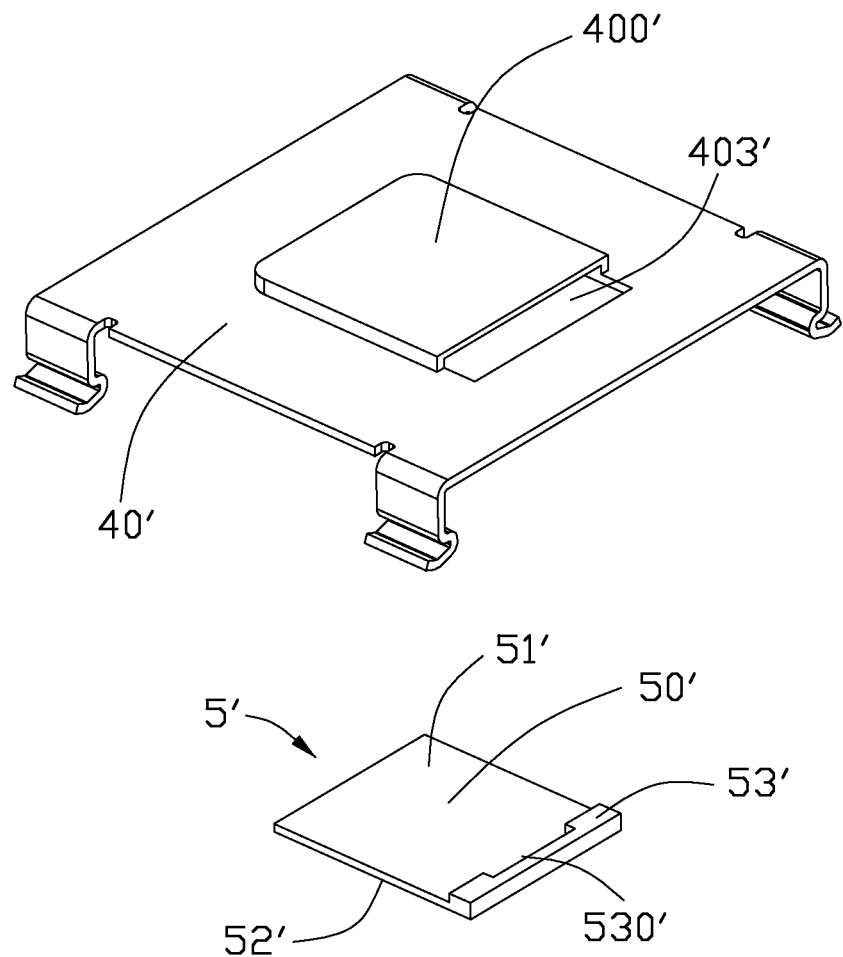
FIG. 5 is a perspectives view of the loading component and mating portion in the second embodiment.
Figure 6:
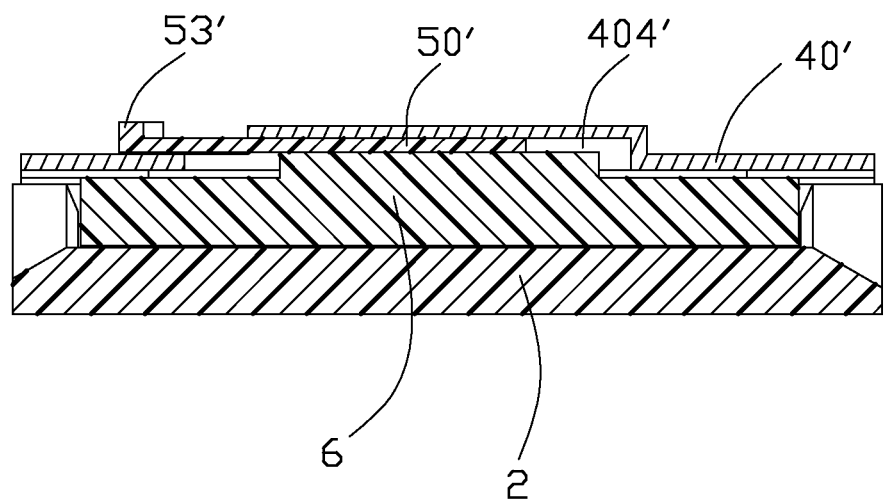
FIG. 6 is a cross-section view of the assembled electrical connector according to the second embodiment.

FIGS. 5-6 show the second embodiment of the loading component 5' with corresponding mating portion 400'. The mating portion 400' is configured with a concave 404' in bottom surface of the main body 40'. The concave 404' is run through a top surface of the main body 40' by an opening 403' which is part defined on the top surface of the main body 40' and part defined on sidewalls formed with the concave 404'. The loading component 5' has a plate 50' with a top surface 51' and a bottom surface 52'. One end of the top surface 51' has a block 53' extending upwardly therefrom. The block 53' defines a recess 530' to allow operating by fingers of operator.

Figure 7:
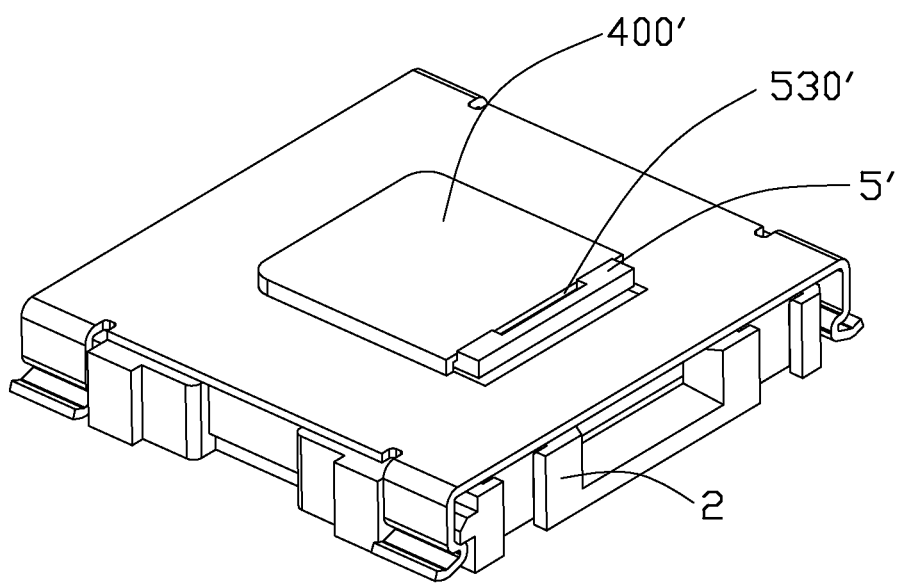
FIG. 7 is an assembled view of the second embodiment of the electrical connector.

Referring to FIGS. 6-7, when the cover 4' mounted to the housing 2 with the electronic package 6 assembled therebetween. The loading component 5' is inserted into the concave 404' from the opening 403' till the block 53' against the sidewalls of the opening 403', and the bottom surface 52' against the top side of the electronic package 6 to press the electronic package 6 electrically connected with the contacts (not shown in FIG. 6) in the housing 2.

In the present invention, the loading component 5,5' can directly press the electronic package 6 and also directly connects with the mating portion 400,400' of the cover 4, 4' in the vertical direction so as to save the space of a printed circuit board (not shown) and has a small height in the vertical direction Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector for assembling an electronic package, comprising:
    an insulative housing with contacts;
    a cover assembled on the housing and including a main body with a mating portion, the mating portion formed with an entrance; and
    a loading component engaging with the mating portion of the cover and passing through the entrance of the cover to directly press the electronic package;
    wherein the mating portion is configured with a concave at a bottom surface of the cover and the entrance is an opening to communicate a top surface of the main body and the concave;
    wherein the opening is part defined on the top surface of the main body and part is defined on sidewalls of the concave.

2. The electrical connector as claimed in claim 1, wherein the entrance of the cover is a circular aperture with an internal screw thread.

3. The electrical connector as claimed in claim 2, wherein the loading component has a cylindrical surface with an external thread to cooperate with the internal screw thread of the cover.

4. The electrical connector as claimed in claim 3, wherein the loading component has a flat cylinder in shape with a top surface defined a groove for operating by a tool.

5. An loading device for an electrical connector, comprising:
    an electronic package;
    a cover including a main portion located upon the electronic package and a mating portion disposed on the main portion; and
    a loading component located between the cover and the electronic package such that the loading component has a bottom surface to press a top side of the electronic package;
    wherein the mating portion is formed with a concave at a bottom surface of the cover and an opening is defined to communicate the concave and a top surface of the main portion;
    wherein the opening is part defined on the top surface of the main body and part is defined on sidewalls of the concave.

6. A electrical connector assembly comprising:
    an insulative housing defining a receiving cavity;
    a plurality of contacts disposed in the housing with contacting sections upwardly extending into the receiving cavity;
    an electronic package received in the receiving cavity;
    a cover having main body with a mating portion mounted upon the housing and covering said electronic package; and
    a loading component moveably associated with the cover with a portion extending toward the receiving cavity to directly contact and impose a downward force upon the electronic package;
    wherein the mating portion is configured with a concave at a bottom surface of the cover and an opening to communicate a top surface of the main body and the concave;
    wherein the loading component has a plate with a top surface and a bottom surface, and one end of the top surface has a block extending upwardly therefrom to press against sidewalls of the opening.

7. The electrical connector as claimed in claim 1, wherein the loading component has a plate with a top surface and a bottom surface, and one end of the top surface has a block extending upwardly therefrom to press against the sidewalls of the opening.

8. The electrical connector as claimed in claim 7, wherein the block defines a recess to allow operating by fingers of an operator.

9. The electrical connector as claimed in claim 1, wherein the cover includes latches extending downwardly from edges of the main body to engage with the insulative housing, and each latch includes a contacting portion extending downwardly from the main body and a bent portion extending downwardly from the contacting portion.

10. The electrical connector as claimed in claim 9, wherein the insulative housing has an engaging portion with a top engaging portion and a lower engaging portion in a vertical direction, and a rib formed between the top engaging portion and the lower engaging portion.

11. The electrical connector as claimed in claim 10, wherein the bent portion includes a mating surface extending inwardly to engage with a bottom surface of the rib and an end portion extending outwardly.

12. The electrical connector assembly as claimed in claim 6, wherein said loading component is located at a center of the cover.

13. The loading device as claimed in claim 5, wherein the mating portion of the cover is a circular aperture with internal screw thread and the loading component has a cylindrical surface with external thread to cooperate the internal screw thread of the cover.

14. The electrical connector assembly as claimed in claim 6, wherein said cover include latches to hook engaging portions of the housing so as to prevent said cover from being withdrawn from the housing under a tension derived from the downward force.

15. The loading device as claimed in claim 5, wherein the loading component has a plate received in the concave and having a top surface engage with the concave.

16. The electrical connector assembly as claimed in claim 6, wherein said movement of loading component is capable of adjusting said downward force.

17. The electrical connector assembly as claimed in claim 6, wherein the loading component moves in a vertical direction with regard to the cover.

\* \* \* \* \*